United States Patent [19]

Tsukakoshi

[11] Patent Number: 5,363,382
[45] Date of Patent: Nov. 8, 1994

[54] FAULT ANALYSIS APPARATUS FOR MEMORIES HAVING REDUNDANCY CIRCUITS

[75] Inventor: Hisao Tsukakoshi, Yokohama, Japan

[73] Assignee: Kabushiki Kaisha Toshiba, Kawasaki, Japan

[21] Appl. No.: 791,171

[22] Filed: Nov. 13, 1991

[30] Foreign Application Priority Data

Nov. 13, 1990 [JP] Japan .................... 2-306452

[51] Int. Cl.[5] .......................... G01R 31/28
[52] U.S. Cl. ................. 371/21.2; 371/10.3
[58] Field of Search ............ 371/10.3, 21.1, 21.2

[56] References Cited

U.S. PATENT DOCUMENTS

| | | | |
|---|---|---|---|
| 4,460,997 | 7/1984 | Harns | 371/10.3 |
| 4,627,053 | 12/1986 | Yamaki et al. | 371/10.3 |
| 4,627,063 | 12/1986 | Yamaki et al. | 371/10.3 |
| 4,628,509 | 12/1986 | Kawaguchi | 371/10.3 |

FOREIGN PATENT DOCUMENTS 0125633 11/1984 European Pat. Off. .
2206715 1/1989 United Kingdom .

*Primary Examiner*—Charles E. Atkinson
*Attorney, Agent, or Firm*—Foley & Lardner

[57] ABSTRACT

An apparatus for analyzing faults in a memory having a redundancy circuit, includes an algorithmic pattern generator which generates address signals to select a memory cell of a memory under test and data which is written to a selected memory cell, a comparison circuit for performing a read operation after data has been written to a selected memory cell by address signals and comparing the data read and the data from the algorithmic pattern generator to determine whether or not it is in agreement and if it is not in agreement generating a fault signal that indicates that the memory cell is faulty, a fault analysis memory having a number of memory cells, and an address allocation circuit which receives address signals from the algorithmic pattern generator and performs address allocation for the fault analysis memory so that a number of memory cells of the memory under test correspond, based on a predetermined rule, to a single memory cell of the fault analysis memory.

6 Claims, 5 Drawing Sheets

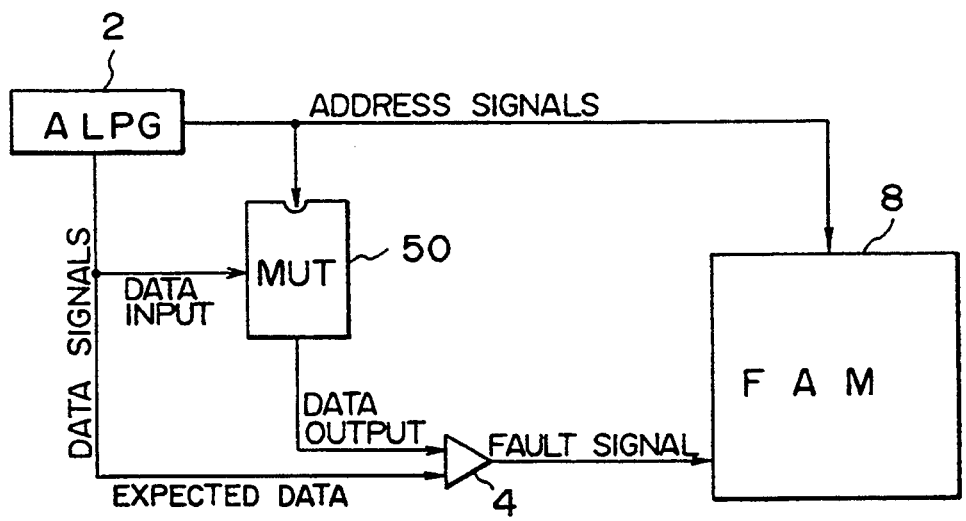
FIG.1 PRIOR ART
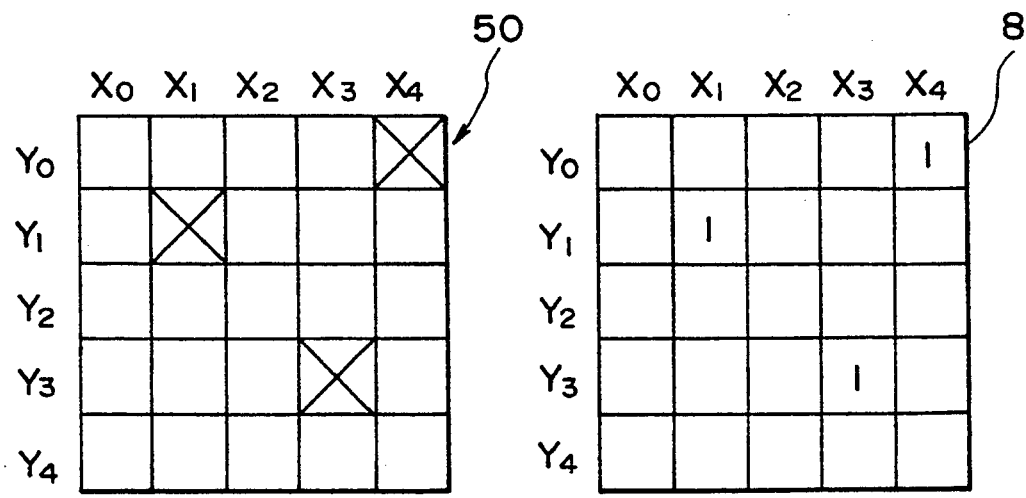
FIG.2A
PRIOR ART
FIG.2B
PRIOR ART

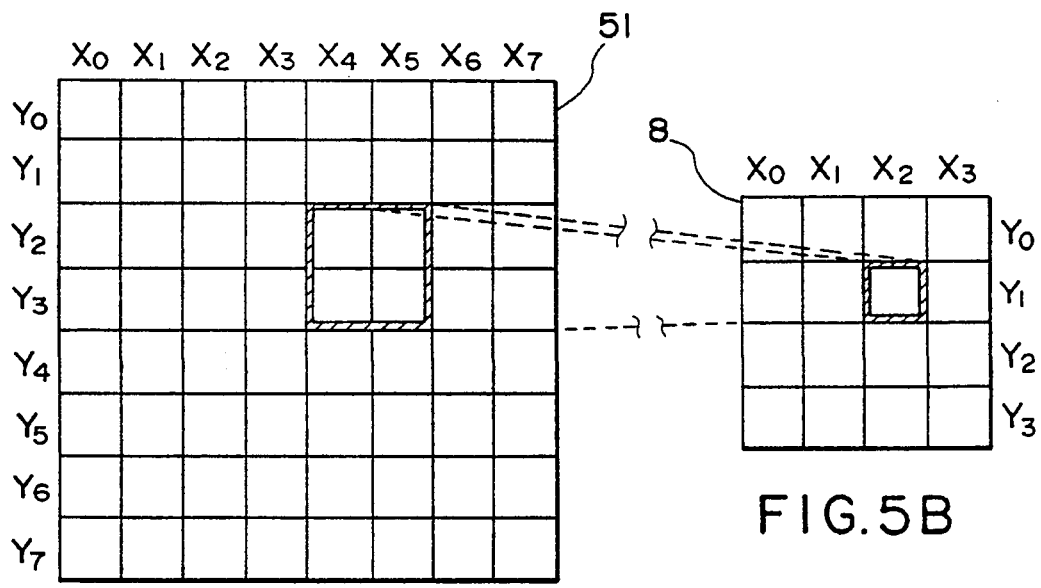
FIG.5A
FIG.5B
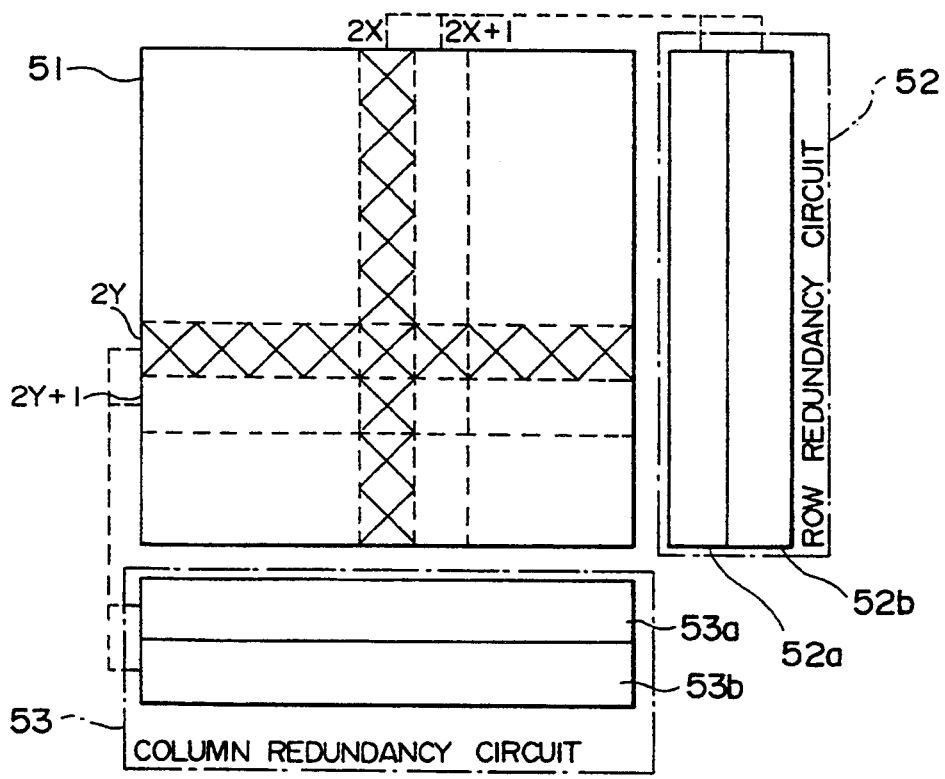
FIG.6

FAULT ANALYSIS APPARATUS FOR MEMORIES HAVING REDUNDANCY CIRCUITS

BACKGROUND OF THE INVENTION

The present invention relates to a memory fault analysis apparatus for analyzing whether an analyzed memory having a redundancy circuit is faulty or not, and whether replacement with a redundancy circuit is possible.

In general, a memory fault analysis apparatus performs individual fault analysis for the memory cells of a memory that has redundancy circuits and which is being analyzed, and when there is a faulty memory cell, it is judged that a redundancy circuit can save the fault. FIG. 1 shows a conventional memory fault analysis apparatus. This memory fault analysis apparatus is provided with an algorithmic pattern generator (hereinafter termed an ALPG) 2, a comparator 4, and a fault analysis memory (hereinafter termed a FAM) 8. First, address signals and data signals for testing are sent from the ALPG 2 to a memory under test (MUT) 50 which is a memory having a redundancy circuit, and read is performed after data has been written to memory cells of the MUT 50 and in accordance with these address signals. Then, the written data and the read data are compared by the comparator 4 and fault signals are sent to the FAM 8 if the two are different. This FAM 8 has a memory area that is the same size as the memory cell array of the MUT 50, and each of the memory cells of the FAM 8 are allocated the same address as a memory cell that corresponds to the MUT 50. Then, when a fault signals is used from the comparator 4, the data "1" is written to the corresponding memory element of the FAM 8. More specifically, as shown in FIG. 2A for example, when there is a fault in a memory cell having the row address $X_4$ and the column address $Y_0$ of the MUT 50, then as shown in FIG. 2B, the data "1" is written in the row address is $X_4$ and the column address is $Y_0$ of the corresponding memory cell. In the following, the address of a memory cell having the row address X and the column address Y is simply expressed as (X, Y). In the same manner, when there is a fault in memory cells that have the addresses $(X_1,Y_1)$ and $(X_3,Y_3)$ in the MUT 50, data "1" is written in the memory cells of the FAM 8 that have the addresses $(X_1,Y_1)$ and $(X_3,Y_3)$. Moreover, the memory cells of the FAM 8 are initialized so as to store the data "0" prior to the performance of analysis processing.

In this manner, the address signals and the data signals from the ALPG 2 are used as the basis for analyzing whether or not each of the memory cells in the MUT 50 has a fault, and for writing "1" to corresponding memory cells in the FAM 8 when there is a fault. The data which is written to this FAM 8 is used as the basis for a judgment apparatus not shown in the figure, to judge whether or not the MUT 50 can be saved by a redundancy circuit.

In a conventional memory fault analysis apparatus such as described above, it is necessary to have a FAM 8 that has a large-capacity measurement memory of the same size as the MUT 50 and so it is necessary to have a FAM 8 having an extremely large memory for the analysis of large-scale memories and for simultaneous analysis of a plural number of memories. For example, if sixteen memories each having a storage capacity of 4 Mbits for example are to be analyzed, then it is necessary to have a FAM that has a minimum capacity of 64 Mbits. Then, when the capacity of the FAM 8 becomes larger, there is the problem of a large increase in the judgment time for whether or not recovery is possible by a redundancy circuit.

SUMMARY OF THE INVENTION

In light of the problems associated with the conventional apparatus, the present invention has as an object the provision of a memory fault analysis apparatus that can reduce the memory capacity of the FAM, and that can also reduce the time for judging whether or not recovery is possible.

The memory fault analysis apparatus of the present invention is provided with an algorithmic pattern generator which generates address signals for selecting a memory cell of a memory to be analyzed, and that has a redundancy circuit and generates data which is written to a selected memory cell; a comparison means performs read after data has been written to a selected memory cell by address signals and then compares the read data and data from an algorithmic pattern generator to determine whether or not it is in agreement. If it is not in agreement a fault signal which indicates that the memory cell is faulty is generated. An address allocation means receives address signals from an algorithmic pattern generator and performs address allocation for a fault analysis memory so that a plural number of memory cells of a memory under test (MUT) correspond based on a predetermined rule to a single memory cell of a fault analysis memory. The fault analysis memory writes fault information in to a memory cell corresponding to a memory cell of the memory under test which has the fault, when fault signals indicating the fault are sent from the comparison means.

According to the memory fault analysis apparatus of the present invention and having the configuration described above, the address allocation means performs address allocation, that is, address compression for the fault analysis memory so that a plural number of memory cells of the MUT correspond on the basis of a predetermined rule to one of the memory cells of the fault analysis memory, when at least one memory cell of the plural number of memory cells is faulty, there is the write of fault information to the memory cell corresponding to the fault analysis memory. By performing address compression, the size of the area necessary for the FAM becomes smaller than that required in the conventional apparatus and by this it is possible to reduce the judgment time for fault recovery.

According to the present invention as has been described above, performing address compression by the fault analysis memory enables the capacity of the FAM to be reduced and also enables the time required to judge fault recovery to be shortened.

BRIEF DESCRIPTION OF THE DRAWINGS

In the appended figures,

FIG. 1 is a block diagram indicating the configuration of a conventional memory fault analysis apparatus;

FIGS. 2A-B are views describing the operation of a conventional memory fault analysis apparatus;

FIG. 5A–B are views describing address allocation in the present invention;

FIG. 6 is a view describing the configuration of a memory under test (MUT) being analyzed by the present invention;

DETAILED DESCRIPTION OF THE PREFERRED EMBODIMENTS

Figure 3:
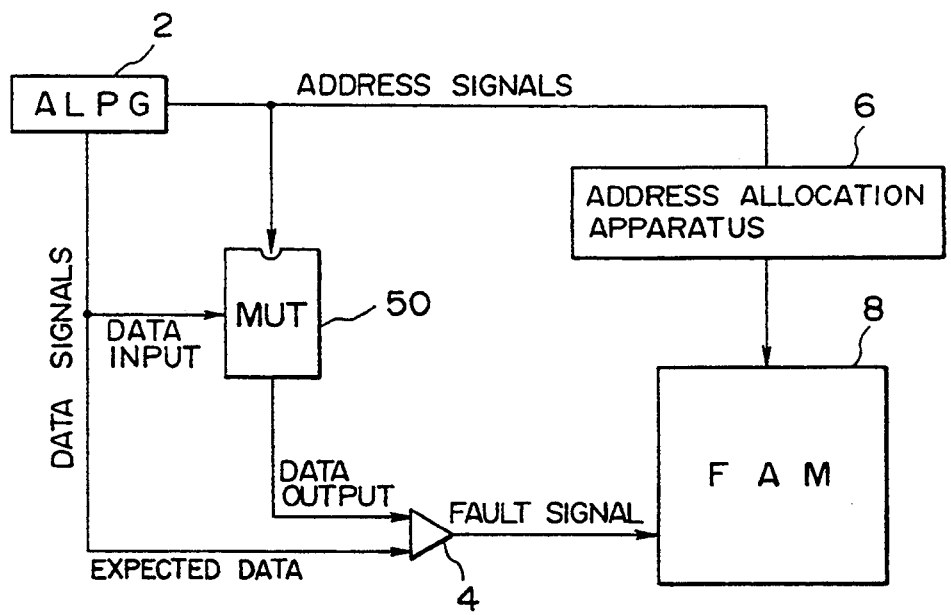
FIG. 3 is a block diagram showing the configuration of a first embodiment of a memory fault analysis apparatus according to the present invention.

FIG. 3 is a block diagram showing the configuration of a first embodiment of a memory fault analysis apparatus according to the present invention. The memory fault analysis apparatus of this embodiment is the conventional memory fault analysis apparatus shown in FIG. 1, to which an address allocation apparatus 6 has been newly provided. This address allocation apparatus 6 receives address signals from the ALPG 2 and performs address allocation with respect to the FAM 8. This address allocation is performed on the basis of the number of rows and columns that are switched when one faulty row or one faulty column of the MUT 50 is switched for one redundant cell row or one redundant cell column. This is shown in FIGS. 5A–B and FIG. 6.

FIG. 6 shows the MUT 50 and this MUT 50 has a memory cell array 51, a row redundancy circuit 52 and a column redundancy circuit 53. When the cell line of the memory cell array 51 for which the row address is 2X and the column address is 2Y is faulty and the cell row for which the row address is 2X is replaced with the redundancy cell row 52a of the row redundancy circuit 52, the cell row for which the row address is 2X+1 is also replaced at the same time with the other redundancy cell row 52b of the row redundancy circuit 52, and when the cell column for which the column address is 2Y is replaced with the redundancy cell column 53a of the column redundancy circuit 53, the cell column for which the column address is 2Y+1 is also replaced at the same time with the other redundancy cell column 53b of the column redundancy circuit 53, then the number of rows and columns that are replaced at the same time is two each.

FIGS. 5A–B show the address allocation of the FAM 8 for this case. The two continuous cell rows $X_{2i}$, $X_{2i+1}$ (i=0, 1, . . .) of the memory cell array 51 of the MUT 50 are allocated addresses so as to correspond to cell rows $X_i$ of the FAM 8 and the two continuous cell rows $Y_{2i}$, $Y_{2i+1}$ (i=0, 1, . . .) of the memory cell array 51 of the MUT 50 are allocated addresses so as to correspond to cell rows $Y_i$ of the FAM 8. More specifically, as shown in FIG. 5 for example, each memory cell for which the address of the cell array 51 is $(X_4, Y_2)$, $(X_4, Y_3)$ $(X_5, Y_2)$ and $(X_5, Y_3)$ is allocated so as to correspond with the memory cell of the FAM 8 for which the address is $(X_2, Y_1)$. Accordingly, it is possible to have address compression. When the address of the cell row Y or the cell row X of the memory cell array 51 of the MUT 50 is expressed in binary notation as $A_n A_{n-1} \ldots A_1 A_0$ ($A_i$ (i=0, . . . n) where A is either 0 or 1), then with the lowest order ignored, the binary $A_n A_{n-1} \ldots A_1$ can be obtained as the address corresponding with the cell row or cell column of the FAM 8.

Figure 4A:
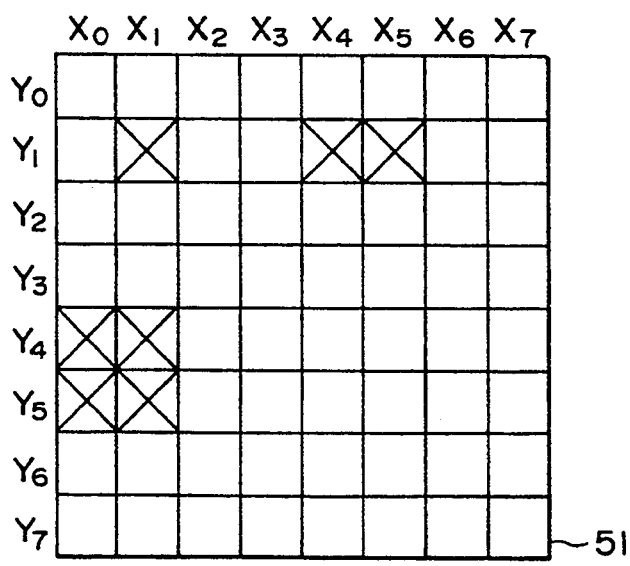
FIGS. 4A-B are views for describing the write of fault information to a fault analysis memory (FAM) of the present invention.
Figure 4B:
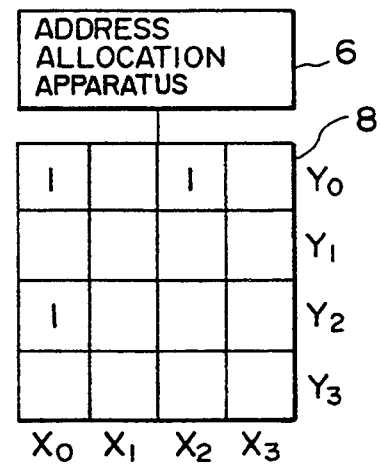

The following is a description of fault analysis performed using a FAM 8 for which address allocation such as this has been performed, with reference to FIGS. 4A–B. Now, as shown in FIGS. 4A–B, the memory cell array 51 of the MUT 50 is faulty at addresses $(X_1, Y_1)$, $(X_4, Y_1)$, $(X_5, Y_1)$, $(X_0, Y_4)$, $(X_0, Y_5)$ and $(X_1, Y_5)$. When this occurs, the memory cell with the address of $(X_0, Y_0)$ is faulty and so even if the memory cells of the memory cell array 51 and having addresses $(X_0, Y_0)$, $(X_1, Y_0)$ and $(X_0, Y_1)$ are not faulty, the data "1" will be written to the FAM 8. Then the addresses ($X_0, Y_4$), $(X_1, Y_4)$, $(X_0, Y_5)$ and $(X_1, Y_5)$ are faulty and so the data "1" is written to the memory cell which has the corresponding address in the FAM 8.

After fault analysis has been performed in this manner, the data that is written to the FAM 8 is used as the basis for the judgment apparatus (not indicated in the figure) to judge whether or not the MUT 50 can be recovered. For example, when the data that is written to the FAM 8 is as shown in FIG. 4B, the number of row redundancy circuits and column redundancy circuits necessary for recovery are one each and so recovery is possible.

According to the first embodiment as described above, the size of the necessary area of the FAM 8 becomes approximately one quarter of the size conventionally required. And the judgment time for fault recovery is reduced by scanning a small area.

Moreover, in the first embodiment described above, the description was given for when there were two rows and two columns for replacement at the same time but when the number of rows and the number of columns for replacement at the same time are each m ($\geq 1$) and n ($\geq 1$) (with the exception of where m=n=1), then it is possible to have address allocation in the same manner, and the size of the necessary area of the FAM 8 becomes $1/(m \times n)$ of the size conventionally required.

Figure 7:
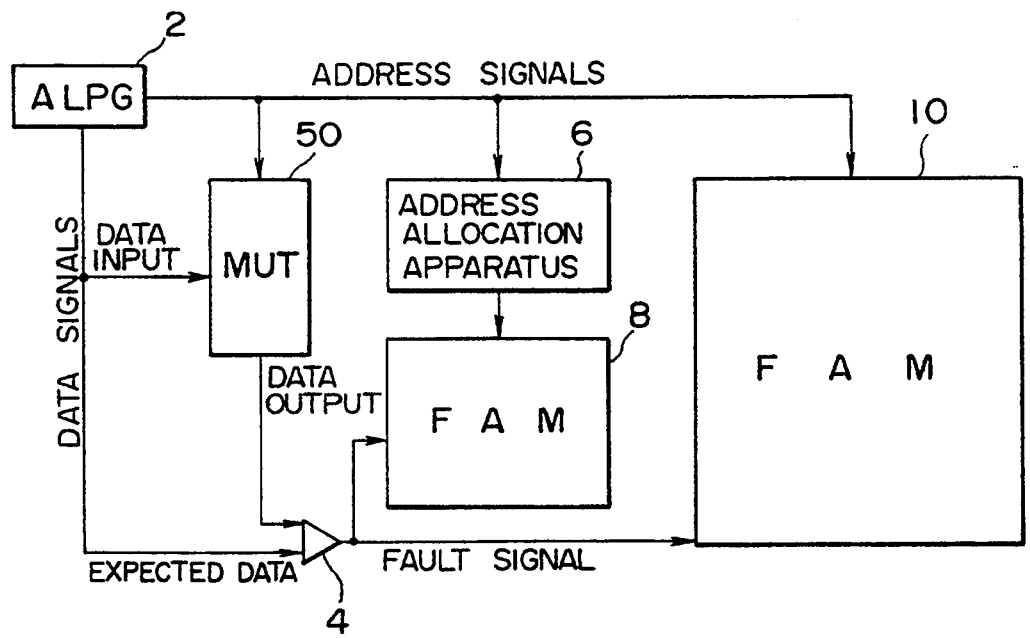
FIG. 7 is a block diagram showing the configuration of a second embodiment of a memory fault analysis apparatus according to the present invention.
Figures 8A, 8B, 8C:
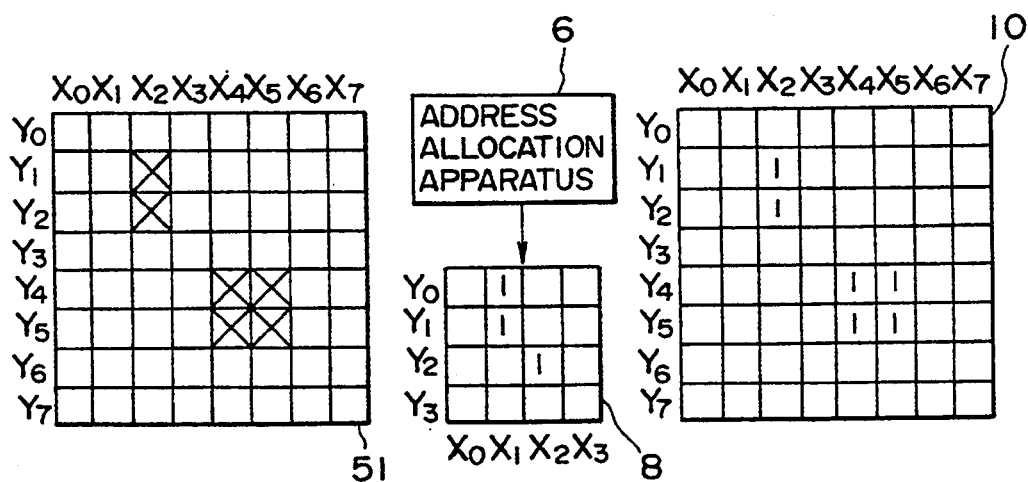
FIG. 8 is a view describing the operation of a second embodiment of a memory fault analysis apparatus according to the present invention.

FIG. 7 shows the configuration of a second embodiment of the memory fault analysis apparatus according to the second embodiment. The memory fault analysis apparatus of this second embodiment is the memory fault analysis apparatus of the first embodiment and shown in FIG. 3, and which is newly provided with a fault analysis memory (FAM) 10. This FAM 10 has a memory area of the same size as the MUT 50 which is being analyzed, and when there is a fault in the memory cell having the address (X, Y) of the memory cell array 51 of the MUT 50, the fault signals from the comparator 4 are used as the basis to write the data "1" to the memory cell that has the address (X, Y) and corresponding to the memory array of the FAM 10. More specifically, as shown in FIG. 8A, when there are faults in memory cells of the memory cell array 51 of the MUT 50 and having the addresses of $(X_2, Y_1)$, $(X_2, Y_2)$, $(X_4, Y_4)$, $(X_4, Y_5)$, $(X_5, Y_4)$ and, $(X_5, Y_5)$, then the data "1" is written to the corresponding memory array of the FAM 10 and having the addresses of $(X_2, Y_1)$, $(X_2, Y_2)$, $(X_4, Y_4)$, $(X_4, Y_5)$, $(X_5, Y_4)$ and, $(X_5, Y_5)$. Moreover, the FAM 8 performs address compression at this time and the data "1" is written to the memory cells that have the addresses $(X_1, Y_0)$, $(X_1, Y_1)$ and $(X_2, Y_2)$.

In this second embodiment, the FAM 8 which has the fault information that has undergone address compression is used for judgment to determine whether or not recovery is possible using the redundancy circuits, and the FAM 10 which has the fault information that has not undergone address compression is used in the output of the field map and the like for fault analysis. Needless to say, the second embodiment can obtain the same effect as the first embodiment.

Figure 9:
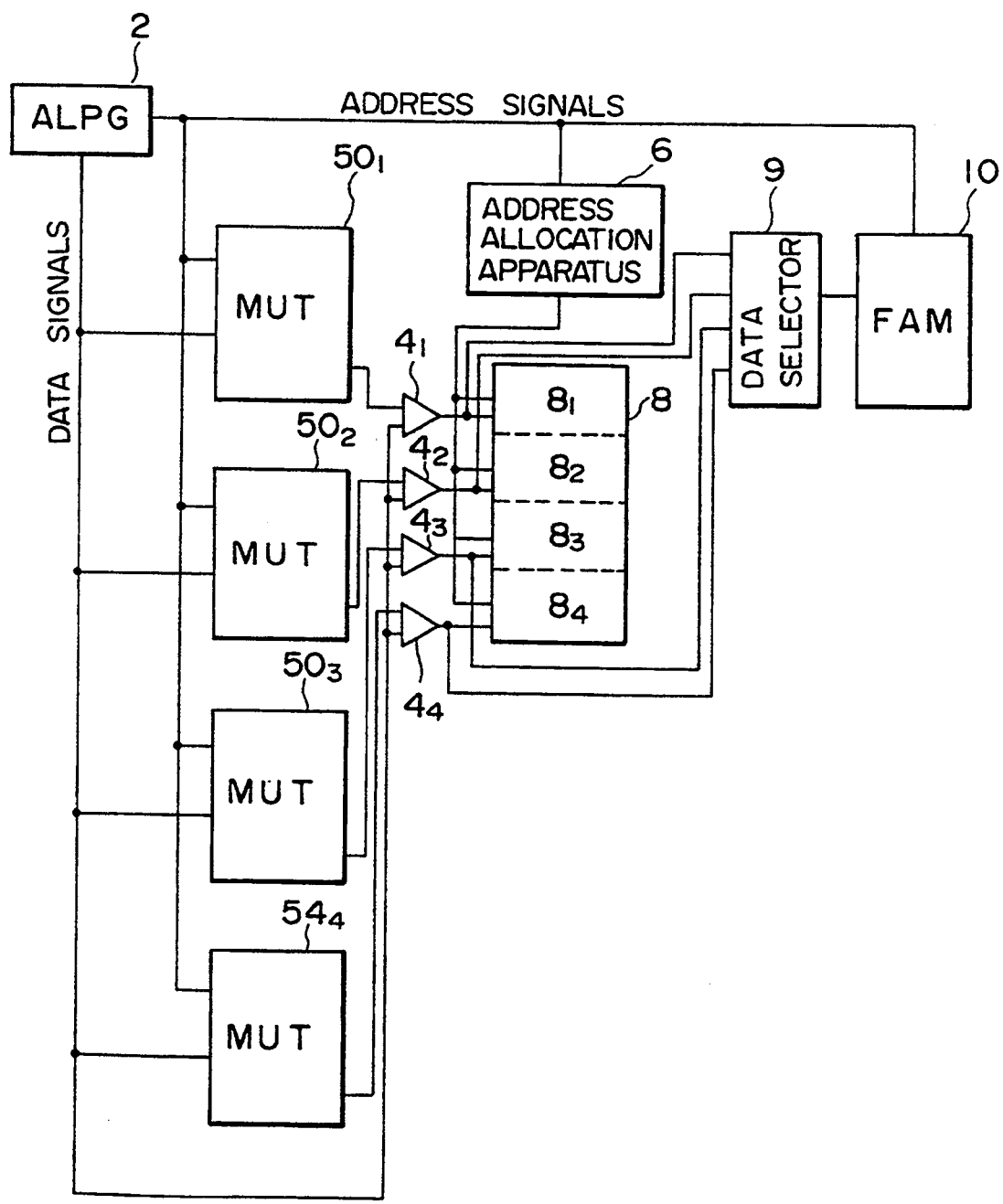
FIG. 9 is a view describing the operation of a third embodiment of a memory fault analysis apparatus according to the present invention.

FIG. 9 shows a configuration of a third embodiment of a memory fault analysis apparatus according to the present invention. The memory fault analysis apparatus of this third embodiment is provided for the simultaneous analysis of a plural number (four, in this embodiment) of MUT $50_1$, $50_2$, $50_3$ and $50_4$, and is provided with an ALPG 2, comparators $4_1$, $4_2$, $4_3$ and $4_4$, an address allocation apparatus 6, a FAM 8, a data selector 9 and a FAM 10. The FAM 8 performs address allocation (address compression) by the address allocation apparatus 6 but the FAM 10 does not perform address compression. When a memory cell of the MUT $50_i$ (i=1, ... 4) is faulty, the comparator $4_1$ generates fault signals and the fault information (the data "1") is written to the corresponding memory cell of the divided area of the FAM 8. On the other hand, of the four MUT ($50_1$, $50_2$, $50_3$, $50_4$) the fault information is written to the FAM 10 for the one MUT $50i$ that was selected by the data selector 9. This is performed when it is not necessary to have the original fault address since original fault addresses are not known when there is fault analysis by field mapping.

Needless to say, the third embodiment can obtain the same effect as the first embodiment, and it is possible to have simultaneous fault analysis for a plural number of memories under test.

What is claimed is:

1. An apparatus for analyzing faults in a memory having a redundancy circuit, comprising:
   an algorithmic pattern generator for generating address signals to select memory cells in a memory under test MUT), said MUT being a measurement object having a redundancy circuit, said algorithmic pattern generator generating data supplied to said selected memory cells;
   comparison means for performing a read operation of said data after data have been written into said selected memory cells selected by said address signals and comparing data read with said data supplied from said algorithmic pattern generator to determine whether or not both said data read and said data from said algorithmic pattern generator are in agreement, if both said data read and said data from said algorithmic pattern generator are not in agreement, generating a fault signal to indicate that said selected memory cells are faulty;
   a fault analysis memory having a first function of storing fault data from a plural number of memory cells of said MUT in one memory cell in said fault analysis memory ,and a second function of storing said fault data from one of said memory cells of said MUT in said one memory cell of said fault analysis memory; and
   address allocation means for receiving address signals from said algorithmic pattern generator and performing address allocation for said fault analysis memory so that said plural number of memory cells of said memory under test correspond, based on a predetermined rule, to a single memory cell of said fault analysis memory, and wherein said fault analysis memory writes fault information into a memory cell corresponding to a memory cell of said MUT having the fault, whenever said fault signal indicating said fault is sent from said comparison means.

2. The memory fault analysis apparatus of claim 1, wherein:
   said fault analysis memory is comprised of a first fault analysis memory having a plurality of memory cells corresponding to a first predetermined number of memory cells of said memory under test, and a second fault analysis memory having a plurality of memory cells corresponding to a second predetermined number of said memory under test.

3. The memory fault analysis apparatus of claim 2, further comprising:
   said second fault analysis memory, having a memory area of the same size as said memory under test, wherein said second fault analysis memory writes data to a memory cell on the basis of said fault signals output from said comparison means when said memory under test is faulty.

4. The memory fault analysis apparatus of claim 1, wherein:
   said memory under test is provided in a plural number, and said fault analysis apparatus performs simultaneous analysis of said plural number of memories under test.

5. The memory fault analysis apparatus of claim 4, further comprising:
   a second fault analysis memory, having a memory area of the same size as said memory under test, wherein said second fault analysis memory writes data to a memory cell on the basis of said fault signals output from said comparison means when said memory under test is faulty.

6. The memory fault analysis apparatus of claim 5, wherein:
   said first fault analysis memory performs address allocation by said address allocation means and said second fault analysis memory writes fault information of one selected memory under test and does not perform address allocation.

* * * * *